(12) United States Patent
Jung et al.

(10) Patent No.: US 11,716,840 B2
(45) Date of Patent: Aug. 1, 2023

(54) SEMICONDUCTOR MEMORY DEVICE INCLUDING CAPACITOR

(71) Applicant: SAMSUNG ELECTRONICS CO., LTD., Suwon-si (KR)

(72) Inventors: Kyooho Jung, Seoul (KR); Yukyung Shin, Suwon-si (KR); Jinho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 6 days.

(21) Appl. No.: 17/571,935

(22) Filed: Jan. 10, 2022

(65) Prior Publication Data

US 2023/0005922 A1    Jan. 5, 2023

(30) Foreign Application Priority Data

Jul. 5, 2021    (KR) .................. 10-2021-0088022

(51) Int. Cl.
 *H10B 12/00*    (2023.01)

(52) U.S. Cl.
 CPC ......... *H10B 12/315* (2023.02); *H10B 12/033* (2023.02); *H10B 12/34* (2023.02)

(58) Field of Classification Search
 CPC ......... H01L 27/10852; H01L 27/10814; H01L 27/10823; H10B 12/033; H10B 12/315; H10B 12/34
 See application file for complete search history.

(56) References Cited

U.S. PATENT DOCUMENTS

| | | | |
|---|---|---|---|
| 10,700,162 | B2 | 6/2020 | Kim et al. |
| 2019/0267383 | A1 | 8/2019 | Rocklein et al. |
| 2020/0266265 | A1 | 8/2020 | Kang et al. |
| 2020/0312952 | A1 | 10/2020 | Cho et al. |
| 2021/0066446 | A1 | 3/2021 | Lee et al. |
| 2021/0134804 | A1 | 5/2021 | Jung et al. |
| 2021/0296429 | A1 | 9/2021 | Park et al. |

FOREIGN PATENT DOCUMENTS

| | | |
|---|---|---|
| KR | 10-2020-0114865 A | 10/2020 |
| KR | 10-2020-0144209 A | 12/2020 |

*Primary Examiner* — Robert G Bachner
*Assistant Examiner* — Molly K Reida
(74) *Attorney, Agent, or Firm* — Lee IP Law, P.C.

(57) ABSTRACT

A semiconductor device including a substrate; bottom electrodes on the substrate, each bottom electrode including a first region and a second region, the second region containing an additional element relative to the first region; a first supporting pattern on the substrate and in contact with a portion of a side surface of each bottom electrode; a top electrode on the bottom electrodes; a dielectric layer between the bottom electrodes and the top electrode; and a capping layer between the bottom electrodes and the dielectric layer, the capping layer covering a top surface and a bottom surface of the first supporting pattern, wherein the second region is in contact with the capping layer, and the capping layer and the dielectric layer include different materials from each other.

20 Claims, 12 Drawing Sheets

SEMICONDUCTOR MEMORY DEVICE INCLUDING CAPACITOR

CROSS-REFERENCE TO RELATED APPLICATION

This U.S. non-provisional patent application claims priority under 35 U.S.C. § 119 to Korean Patent Application No. 10-2021-0088022, filed on Jul. 5, 2021, in the Korean Intellectual Property Office, the entire contents of which are hereby incorporated by reference.

BACKGROUND

1. Field

Embodiments relate to a semiconductor device.

2. Description of the Related Art

Due to their small-size, multifunctionality, and/or low-cost characteristics, semiconductor devices are considered important elements in the electronic industry. A memory device, which is one of the semiconductor devices, may store logical data.

SUMMARY

The embodiments may be realized by providing a semiconductor device including a substrate; bottom electrodes on the substrate, each bottom electrode including a first region and a second region, the second region containing an additional element relative to the first region; a first supporting pattern on the substrate and in contact with a portion of a side surface of each bottom electrode; a top electrode on the bottom electrodes; a dielectric layer between the bottom electrodes and the top electrode; and a capping layer between the bottom electrodes and the dielectric layer, the capping layer covering a top surface and a bottom surface of the first supporting pattern, wherein the second region is in contact with the capping layer, and the capping layer and the dielectric layer include different materials from each other.

The embodiments may be realized by providing a semiconductor device including a substrate; bottom electrodes on the substrate, each of the bottom electrodes including a first region and a second region, the second region being a doped region; a first supporting pattern on the substrate and in contact with a portion of a side surface of each of the bottom electrodes; a top electrode on the bottom electrodes; a dielectric layer between the bottom electrodes and the top electrode; and a capping layer between the bottom electrodes and the dielectric layer, between a top surface of the first supporting pattern and the dielectric layer, and between a bottom surface of the first supporting pattern and the dielectric layer, wherein the second region is between the first region and the capping layer, and the capping layer includes a doping metal.

The embodiments may be realized by providing a semiconductor device including a semiconductor substrate including a device isolation layer, the device isolation layer defining an active region, the active region including a first impurity region and a pair of second impurity regions, which are spaced apart from each other with the first impurity region therebetween; a word line in the semiconductor substrate and crossing the active region; a bit line on the semiconductor substrate and crossing the word line, the bit line being connected to the first impurity region; a storage node contact on the semiconductor substrate and connected to the second impurity region; a landing pad electrically connected to the storage node contact; bottom electrodes on the landing pad, each of the bottom electrodes including a first region and a second region, the second region containing an additional element relative to the first region; a top electrode on the bottom electrodes; a supporting pattern between the bottom electrodes; a dielectric layer between the bottom electrodes and the top electrode; and a capping layer between the bottom electrodes and the dielectric layer and covering a top surface and a bottom surface of the supporting pattern, wherein the second region is between the first region and the capping layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
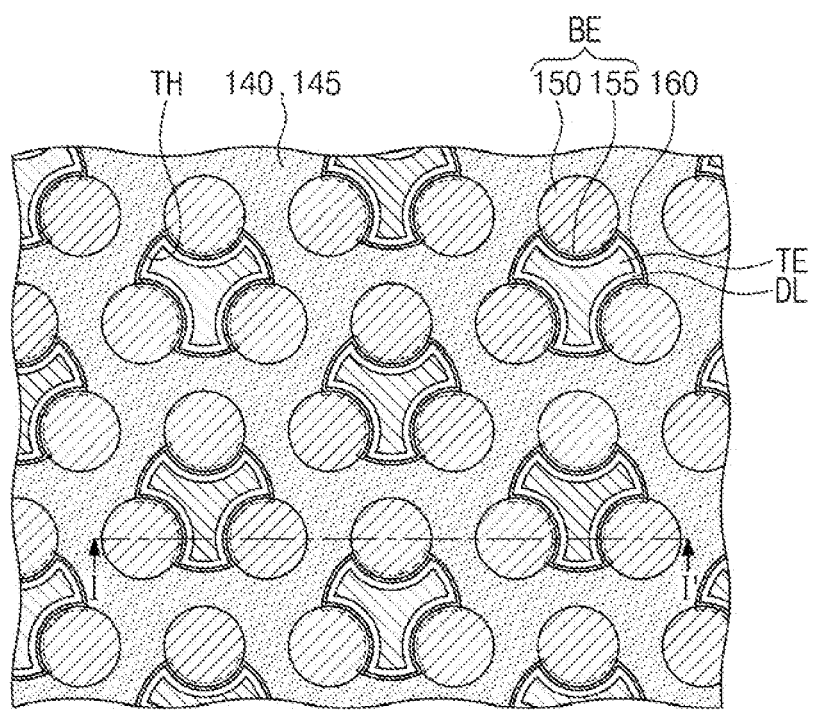
FIG. 1 is a plan view of a semiconductor device according to an embodiment.
Figure 2:
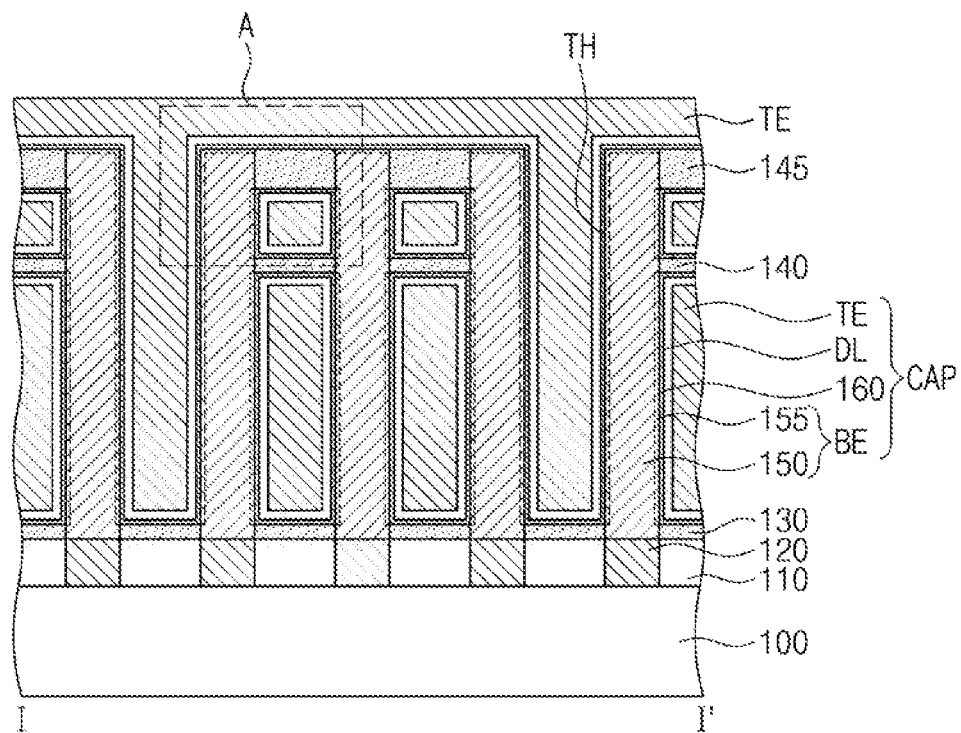
FIG. 2 is a sectional view taken along a line I-I' of FIG. 1.
Figure 3:
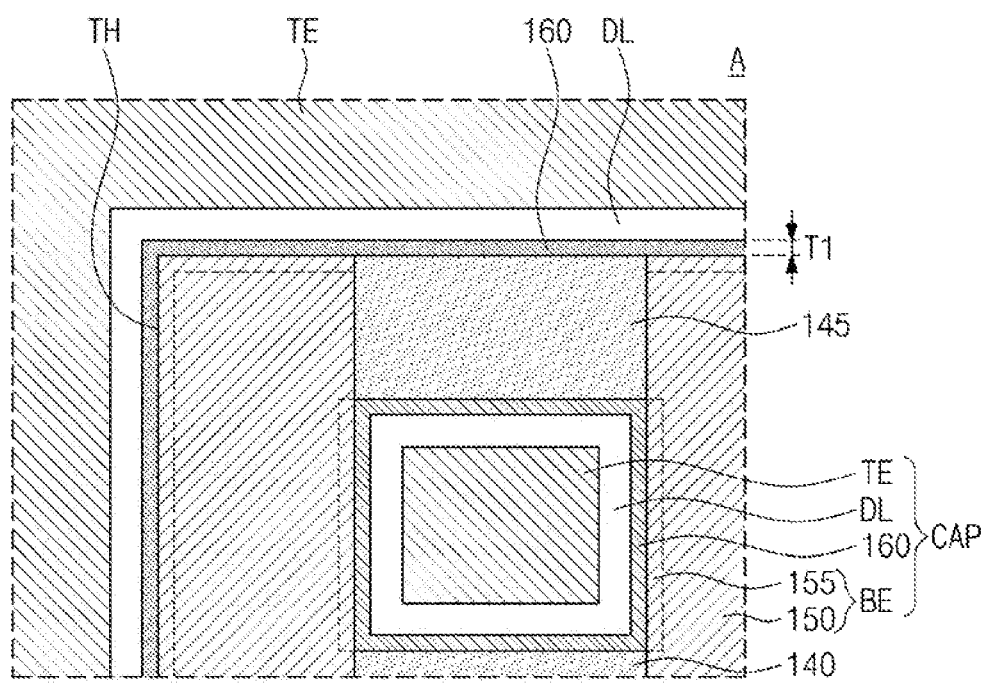
FIG. 3 is an enlarged sectional view of a portion 'A' of FIG. 2.

FIG. 1 is a plan view of a semiconductor device according to an embodiment. FIG. 2 is a sectional view taken along a line I-I' of FIG. 1. FIG. 3 is an enlarged sectional view of a portion 'A' of FIG. 2.

Referring to FIGS. 1, 2, and 3, a substrate 100 may be provided. The substrate 100 may be a semiconductor substrate. In an implementation, the substrate 100 may be a silicon substrate, a germanium substrate, or a silicon-germanium substrate.

An interlayer insulating layer 110 may be on the substrate 100. The interlayer insulating layer 110 may cover at least a portion of a top surface of the substrate 100. The interlayer insulating layer 110 may be formed of or include an insulating material (e.g., silicon oxide).

A conductive contact 120 may be on the substrate 100. The conductive contact 120 may penetrate the interlayer insulating layer 110 and may be electrically connected to an interconnection line in the substrate 100. In an implementation, a plurality of the conductive contacts 120 may be spaced apart from each other horizontally (e.g., in a direction parallel to the top surface of the substrate 100). The conductive contact 120 may be formed of or include, e.g., doped poly silicon, titanium nitride, or tungsten. As used herein, the term "or" is not an exclusive term, e.g., "A or B" would include A, B, or A and B. In the present specification, the description of two elements being electrically connected/coupled to each other may mean that the elements are directly connected/coupled to each other or are indirectly connected/coupled to each other through another conductive element.

In an implementation, a device isolation layer may be in the substrate 100 to define active regions. Word lines may be buried in the substrate 100. The word lines may be electrically disconnected from the substrate 100 by a gate insulating layer and a capping pattern. Impurity injection regions serving as source/drain regions may be in portions of the substrate 100 at both sides of the word lines. Bit lines may be electrically connected to the impurity injection regions, respectively, at sides of the word lines. The conductive contacts 120 may be electrically connected to the impurity injection regions, respectively, which are at other sides of the word lines.

An etch stop layer 130 may be on the interlayer insulating layer 110. The etch stop layer 130 may cover a top surface of the interlayer insulating layer 110. The etch stop layer 130 may be formed of or include an insulating material (e.g., silicon oxide, silicon nitride, silicon oxynitride, silicon boron nitride, or silicon carbon nitride). The etch stop layer 130 may be a single layer or a multiple layer.

A bottom electrode BE may be on the substrate 100. The bottom electrode BE may penetrate the etch stop layer 130 and may be electrically connected to the conductive contact 120. In an implementation, the bottom electrode BE may have a pillar shape. In an implementation, the bottom electrode BE may have a cylinder shape with a closed bottom surface. In an implementation, a plurality of the bottom electrodes BE may be spaced apart from each other horizontally (e.g., in the direction parallel to the top surface of the substrate 100). The bottom electrodes BE may be on the conductive contacts 120, respectively. When viewed in a plan view, the bottom electrodes BE may be arranged to form a honeycomb shape. In an implementation, six bottom electrodes BE may be around one of the bottom electrodes BE to surround the one of the bottom electrodes BE in a hexagonal shape. The bottom electrodes BE may be formed of or include a conductive material (e.g., doped poly silicon, metals, metal oxides, or metal nitrides). In an implementation, the bottom electrodes BE may be formed of or include titanium nitride.

A first supporting pattern 140 and a second supporting pattern 145 may be between the bottom electrodes BE. The first supporting pattern 140 and the second supporting pattern 145 may be vertically spaced apart from each other. The second supporting pattern 145 may be on the first supporting pattern 140. The first supporting pattern 140 and the second supporting pattern 145 may be in direct contact with side surfaces of the bottom electrodes BE. The first supporting pattern 140 and the second supporting pattern 145 may physically support the bottom electrodes BE. The bottom electrodes BE, which are adjacent to each other, may be connected to each other through the first supporting pattern 140 and the second supporting pattern 145. The first supporting pattern 140 may connect lower portions of the bottom electrodes BE to each other, and the second supporting pattern 145 may connect upper portions of the bottom electrodes BE to each other. The second supporting pattern 145 may be located at a level higher than the first supporting pattern 140. In the present specification, the level may mean a vertical distance measured from the top surface of the substrate 100. In an implementation, a top surface of the second supporting pattern 145 may be coplanar with a top surface of the bottom electrode BE. In an implementation, the top surface of the second supporting pattern 145 may be located at a level lower than the top surface of the bottom electrode BE. In an implementation, the first supporting pattern 140 and the second supporting pattern 145 may have different thicknesses from each other. The first supporting pattern 140 and the second supporting pattern 145 may be formed of or include, e.g., silicon nitride, silicon boron nitride, or silicon carbon nitride.

Penetration holes TH may be on the substrate 100. Each of the penetration holes TH may be between three bottom electrodes BE, which are adjacent to each other. Each of the penetration holes TH may expose a portion of a side surface of each of the three bottom electrodes BE, which are adjacent to each other. The penetration holes TH may penetrate the first supporting pattern 140 and the second supporting pattern 145. Each of the penetration holes TH may expose the etch stop layer 130.

A capping layer 160 may be on the substrate 100. The capping layer 160 may conformally cover the bottom electrodes BE, the first supporting pattern 140, and the second supporting pattern 145. The capping layer 160 may conformally cover an inner side surface and a bottom surface of each of the penetration holes TH. The capping layer 160 may be in contact with portions of the bottom electrodes BE, which are not covered with the first supporting pattern 140 and the second supporting pattern 145, and may be in contact with a top surface of the etch stop layer 130. The capping layer 160 may also be in contact with a top surface and a bottom surface of the first supporting pattern 140 and may be in contact with a top surface and a bottom surface of the second supporting pattern 145. The capping layer 160 may be in an electrically insulating state. In an implementation, the bottom electrodes BE, which are horizontally spaced apart from each other, may not be electrically connected to each other by or through the capping layer 160. The capping layer 160 may be formed of or include a different material from the bottom electrodes BE. In an implementation, the capping layer 160 may be formed of or include a metallic material that is different from a metallic material in a first region 150 to be described below. The capping layer 160 may be formed of or include, e.g., a metal oxide or a metal oxynitride. In an implementation, a metallic material in the capping layer 160 may be a doping metal. The doping metal in the capping layer 160 may include a material having a large bandgap. In an implementation, the bandgap of the doping metal in the capping layer 160 may range from 3 eV to 12 eV. The doping metal in the capping layer 160 may include, e.g., Ta, V, Mo, Cr, Sb, Co, Ni, Fe, Nb, or Cu. In an implementation, the capping layer 160 may be formed of or include, e.g., tantalum oxide, vanadium oxide, tantalum oxynitride, or vanadium oxynitride. In an implementation, a thickness T1 of the capping layer 160 may range from 0.05 nm to 0.5 nm.

A dielectric layer DL may be on the substrate 100. The dielectric layer DL may conformally cover a top surface of the capping layer 160. The dielectric layer DL may partially fill the penetration holes TH and may be extended to a region on the top surface of the capping layer 160. In an implementation, the capping layer 160 may be between the bottom electrodes BE and the dielectric layer DL and between the top surface of the etch stop layer 130 and the dielectric layer DL. The capping layer 160 may be between the top surface of the first supporting pattern 140 and the dielectric layer DL and between the bottom surface of the first supporting pattern 140 and the dielectric layer DL. The capping layer 160 may be between the top surface of the second supporting pattern 145 and the dielectric layer DL and between the bottom surface of the second supporting pattern 145 and the dielectric layer DL. The dielectric layer DL may be spaced apart from the bottom electrode BE, the first supporting pattern 140, and the second supporting pattern 145 and may not be in contact with the bottom electrode BE, the first supporting pattern 140, and the second supporting pattern 145. The dielectric layer DL may be formed of or include a material different from the capping layer 160. The dielectric layer DL may be formed of or include, e.g., a silicon oxide or a metal oxide. In an implementation, the dielectric layer DL may be formed of or include, e.g., hafnium oxide, aluminum oxide, zirconium oxide, or lanthanum oxide.

Each of the bottom electrodes BE may include the first region 150 and a second region 155. The first region 150 may be spaced apart from the capping layer 160 and may not be in contact with the capping layer 160. The first region 150 may be in direct contact with the first supporting pattern 140 and the second supporting pattern 145. The first region 150 may correspond to most of the bottom electrode BE. The second region 155 may be a region containing an additional element. In an implementation, the additional element may be a doping metal, and the second region 155 may be a doped region. The second region 155 may be between the first region 150 and the capping layer 160. The second region 155 may be adjacent to or at side and top surfaces of the bottom electrode BE. The second region 155 may be in direct contact with the capping layer 160. In an implementation, when viewed in a plan view, the second region 155 may have an arc shape, between the first region 150 of the bottom electrode BE and the capping layer 160.

The first region 150 may be formed of or include a conductive material (e.g., a metal nitride). In an implementation, the first region 150 may be formed of or include, e.g., titanium nitride, tantalum nitride, or tungsten nitride. In an implementation, the second region 155 may include the same doping metal as the doping metal in the capping layer 160. In an implementation, the second region 155 may include a metal nitride containing a doping metal. The doping metal in the second region 155 may include a material with a large bandgap. The bandgap of the doping metal in the second region 155 may range from 3 eV to 12 eV. The doping metal in the second region 155 may be formed of or include, e.g., Ta, V, Mo, Cr, Sb, Co, Ni, Fe, Nb, or Cu. In an implementation, the second region 155 may include titanium nitride containing the doping metal. In an implementation, the second region 155 may be formed of or include, e.g., tantalum-doped titanium nitride or vanadium-doped titanium nitride. In an implementation, the second region 155 may be formed of or include, e.g., titanium-doped tantalum nitride or titanium-doped vanadium nitride. A concentration of the doping metal in the second region 155 may decrease with decreasing distance to the first region 150. In an implementation, the doping metal in the capping layer 160 may be the same as one of metallic elements in the second region 155. In an implementation, the one of the metallic elements in the second region 155 may be the doping metal. In an implementation, a concentration of the doping metal in the capping layer 160 may be higher than a concentration of the doping metal in the second region 155.

A top electrode TE may be on the dielectric layer DL. The top electrode TE may fill remaining portions of the penetration holes TH. In an implementation, the dielectric layer DL may be between the top electrode TE and the capping layer 160. The top electrode TE may be formed of or include, e.g., titanium nitride, doped polysilicon, or doped silicon germanium. The top electrode TE may be a single layer or a multiple layer. The bottom electrodes BE, the dielectric layer DL, and the top electrode TE may constitute a capacitor CAP. In an implementation, the capacitor CAP may serve as a data storing element in a semiconductor device according to an embodiment.

According to an embodiment, the capping layer 160, which includes a doping metal having a large bandgap, may be between the bottom electrode BE and the dielectric layer DL. In this case, when a voltage is applied to the bottom electrode BE, it is possible to help suppress a depletion region from being formed, to help increase an electrostatic capacitance of a capacitor, and to help reduce an equivalent oxide thickness (EOT). In addition, due to the presence of the capping layer 160, electrons in the bottom electrode BE may be hardly leaked, and thus, it is possible to help reduce a leakage current in the semiconductor device. Furthermore, the capping layer 160 may be in an electrically insulating state, a bridge defect issue in the semiconductor device may be reduced, and thus, the semiconductor device may have an improved reliability property.

FIGS. 4 to 12 are sectional views, which are respectively taken along the line I-I' of FIG. 1 to illustrate stages in a method of fabricating a semiconductor device according to an embodiment. For concise description, a previously described element may be identified by the same reference number without repeating an overlapping description thereof.

Figure 4:
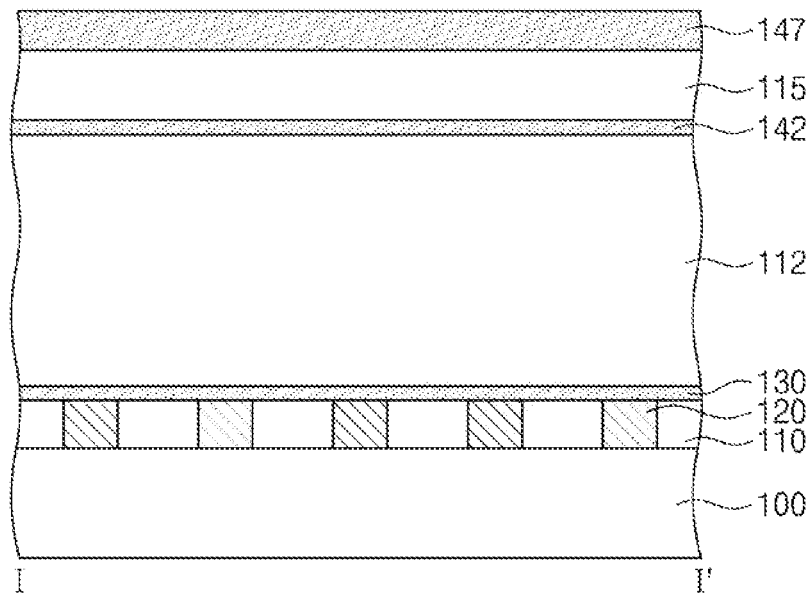
FIGS. 4 to 12 are sectional views, which are respectively taken along the line I-I' of FIG. 1 to illustrate stages in a method of fabricating a semiconductor device according to an embodiment.

Referring to FIG. 4, the substrate 100 may be provided. The interlayer insulating layer 110 may be formed on the substrate 100. The conductive contacts 120 may be formed in the interlayer insulating layer 110. The etch stop layer 130 may be formed on the substrate 100. The etch stop layer 130 may be formed to cover a top surface of the interlayer insulating layer 110 and top surfaces of the conductive contacts 120. A first mold layer 112, a first supporting layer 142, a second mold layer 115, and a second supporting layer 147 may be sequentially formed on the etch stop layer 130. The first supporting layer 142 may be formed of or include a material having an etch selectivity with respect to the first mold layer 112. The second mold layer 115 may be formed of or include a material having an etch selectivity with respect to the first supporting layer 142. The first mold layer 112 and the second mold layer 115 may be formed of or include the same material. In an implementation, the first mold layer 112 and the second mold layer 115 may be formed of or include silicon oxide. The first supporting layer 142 and the second supporting layer 147 may be formed of or include the same material. In an implementation, the first supporting layer 142 and the second supporting layer 147 may be formed of or include, e.g., silicon nitride, silicon boron nitride, or silicon carbon nitride.

Figure 5:
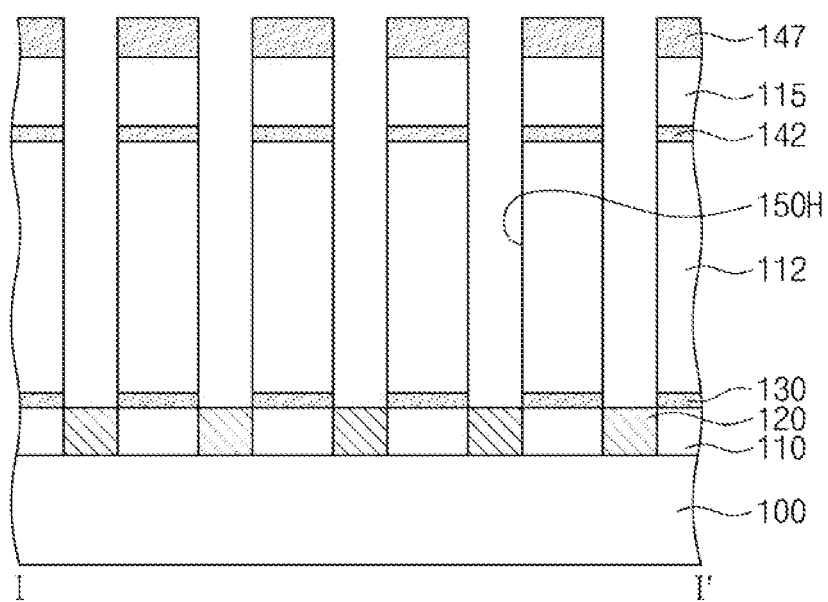

Referring to FIG. 5, the second supporting layer 147, the second mold layer 115, the first supporting layer 142, the first mold layer 112, and the etch stop layer 130 may be sequentially etched to form contact holes 150H exposing the conductive contacts 120, respectively. In an implementation, the etching process may include an anisotropic etching process (e.g., a dry etching process).

Figure 6:
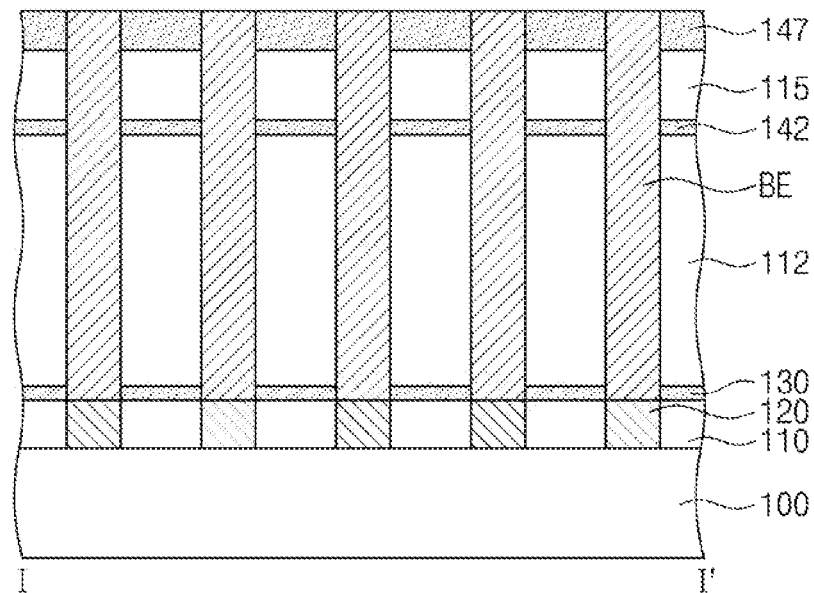

Referring to FIG. 6, the bottom electrodes BE may be formed in the contact holes 150H, respectively. The formation of the bottom electrodes BE may include forming a conductive layer on the substrate 100 to fill the contact holes 150H and performing a planarization process on the conductive layer. In an implementation, the bottom electrodes BE may be formed by, e.g., chemical vapor deposition (CVD), atomic layer deposition (ALD), or physical vapor deposition (PVD) processes. In an implementation, the planarization process may include an etch-back or chemical mechanical polishing (CMP) process. A top surface of the second supporting layer 147 may be exposed by the planarization process.

Figure 7:
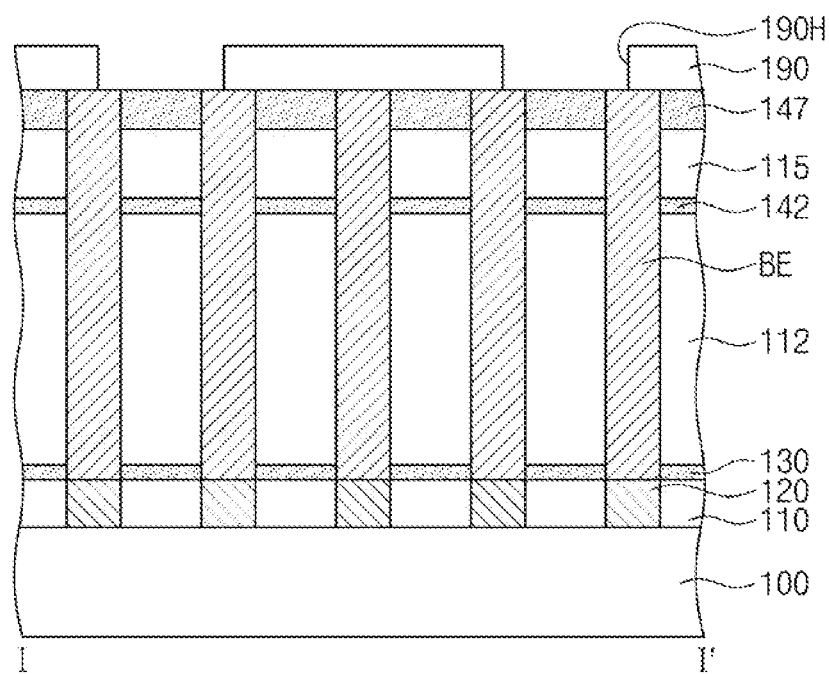

Referring to FIG. 7, a mask pattern 190 may be formed on the second supporting layer 147 and the bottom electrodes BE. The mask pattern 190 may have openings 190H, which are formed to partially expose top surfaces of some of the bottom electrodes BE. In an implementation, each of the openings 190H may be formed to partially expose the top surfaces of three adjacent ones of the bottom electrodes BE and the top surface of the second supporting layer 147 therebetween.

Figure 8:
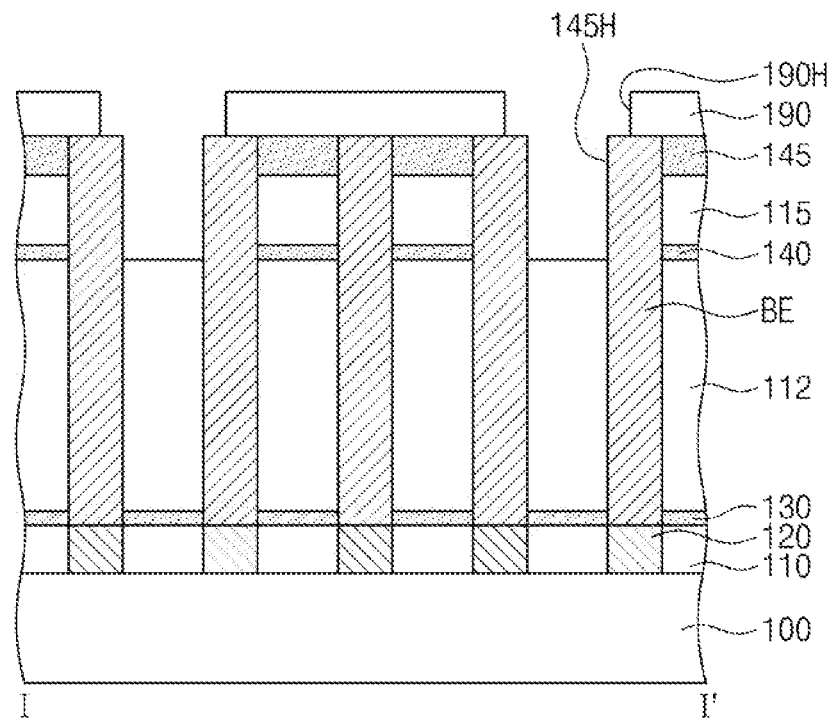

Referring to FIG. 8, an etching process using the mask pattern 190 as an etch mask may be performed on the second supporting layer 147 exposed through the openings 190H, the second mold layer 115 thereunder, and the first supporting layer 142 thereunder. As a result of the etching process, support holes 145H may be formed to expose portions of the top surface of the first mold layer 112 and portions of the top surface of the bottom electrode BE. As a result of the etching process, the second supporting layer 147 may be patterned to form the second supporting pattern 145, and the first supporting layer 142 may be patterned to form the first supporting pattern 140. The etching process may include, e.g., an anisotropic etching process.

Figure 9:
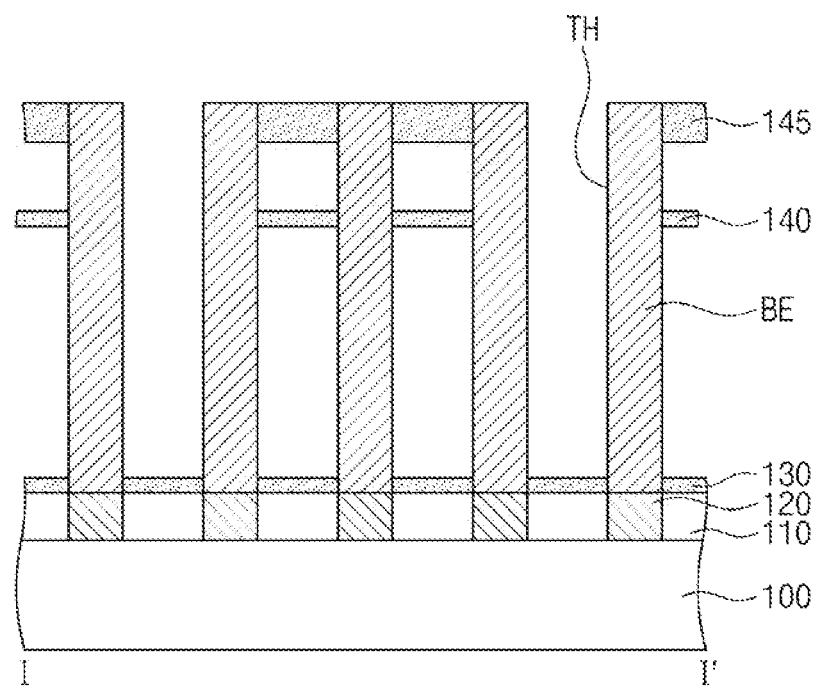

Referring to FIG. 9, the mask pattern 190 may be removed. In an implementation, the mask pattern 190 may be removed by performing ashing and strip processes. An etching process may be performed to remove the second mold layer 115 and the first mold layer 112 exposed through the support holes 145H. As a result of the etching process, the penetration holes TH may be formed to expose the top surface of the etch stop layer 130, the side surfaces of the bottom electrodes BE, the bottom surface of the second supporting pattern 145, and the top and bottom surfaces of the first supporting pattern 140. In an implementation, the etching process may include an isotropic etching process.

In an implementation, the second supporting pattern 145 may be formed by etching the second supporting layer 147 through an anisotropic etching process, and the second mold layer 115, which is exposed through the anisotropic etching process, may be removed by an isotropic etching process. In an implementation, the second mold layer 115 may be removed by a wet etching process using an etching solution having an etch selectivity with respect to the first and second supporting layers 142 and 147. Thereafter, the first supporting pattern 140 may be formed by etching the first supporting layer 142 through an anisotropic etching process, and then, the first mold layer 112, which is exposed through the anisotropic etching process, may be removed. In an implementation, the first mold layer 112 may be removed by a wet etching process using an etching solution having an etch selectivity with respect to the etch stop layer 130 and the first supporting layer 142. Accordingly, the penetration holes TH may be formed to expose the top surface of the etch stop layer 130.

Figure 10:
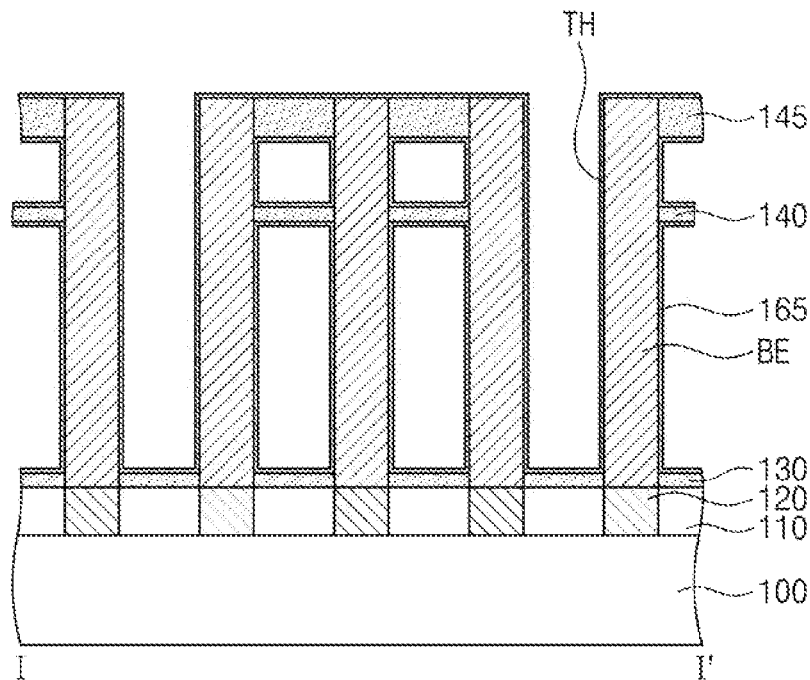

Referring to FIG. 10, a preliminary capping layer 165 may be formed on the substrate 100. The preliminary capping layer 165 may conformally cover the bottom electrodes BE, the first supporting pattern 140, and the second supporting pattern 145. The preliminary capping layer 165 may conformally cover an inner side surface and a bottom surface of each of the penetration holes TH. In an implementation, the preliminary capping layer 165 may conformally cover the side surfaces of the bottom electrodes BE, the top and bottom surfaces of the first supporting pattern 140, the top and bottom surfaces of the second supporting pattern 145, and the top surface of the etch stop layer 130. The preliminary capping layer 165 may be formed by a layer-forming technique having a good step coverage property (e.g., by an atomic layer deposition (ALD) or chemical vapor deposition (CVD) process). The preliminary capping layer 165 may be formed of or include, e.g., a metal (e.g., non-compounded metal), a metal oxide, or a metal nitride. The metal in the preliminary capping layer 165 may be a doping metal. The doping metal may include a material having a large bandgap. In an implementation, the bandgap of the doping metal may range from 3 eV to 12 eV. The doping metal in the preliminary capping layer 165 may include, e.g., Ta, V, Mo, Cr, Sb, Co, Ni, Fe, Nb, or Cu. In an implementation, the preliminary capping layer 165 may be formed of or include, e.g., tantalum, vanadium, tantalum oxide, vanadium oxide, tantalum nitride, or vanadium nitride.

Figure 11:
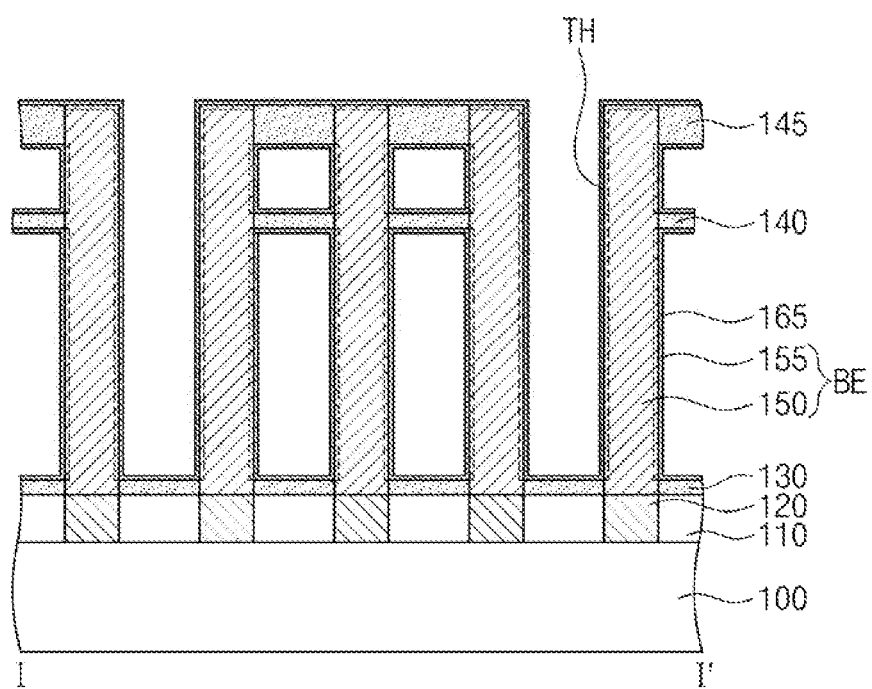

Referring to FIG. 11, the second regions 155 may be formed by performing a thermal treatment process on the substrate 100. As a result of the thermal treatment process, the doping metal in the preliminary capping layer 165 may be diffused into each of the bottom electrodes BE to form the second region 155 and the first region 150. Accordingly, each of the bottom electrodes BE may include the first region 150, into which the doping metal has not been diffused, and the second region 155, into which the doping metal has been diffused. In an implementation, the second region 155 may include the same doping metal as the doping metal in the preliminary capping layer 165. In an implementation, the second region 155 may be formed of or include titanium nitride containing the doping metal. In an implementation, the second region 155 may be formed of or include tantalum-doped titanium nitride or vanadium-doped titanium nitride. In the case where a concentration of the doping metal in the preliminary capping layer 165 is high, the second region 155 may have a structure, in which a metallic element of the bottom electrode BE is diffused as a doping metal, and the doping metal in the preliminary capping layer 165 may be formed in the form of metal nitride. In an implementation, the second region 155 may be formed of or include titanium-doped tantalum nitride or titanium-doped vanadium nitride. The doping metal may be diffused into the second region 155 from the preliminary capping layer 165, and a concentration of the doping metal in the second region 155 may decrease with decreasing distance to the first region 150 (e.g., with increasing distance from the preliminary capping layer 165). The doping metal in the preliminary capping layer 165 may be the same as one of metallic elements in the second region 155. In an implementation, the one of the metallic elements in the second region 155 may be the doping metal. In an implementation, a concentration of the doping metal in the preliminary capping layer 165 may be higher than a concentration of the doping metal in the second region 155. The thermal treatment process may be performed at temperature of 100° C. to 500° C.

By contrast, during the thermal treatment process, the doping metal in the preliminary capping layer 165 may not be diffused into the first supporting pattern 140 and the second supporting pattern 145. In an implementation, the doping metal in the preliminary capping layer 165 may include a material having a large bandgap, and the doping metal in the preliminary capping layer 165 may be selectively diffused into only the bottom electrodes BE.

Figure 12:
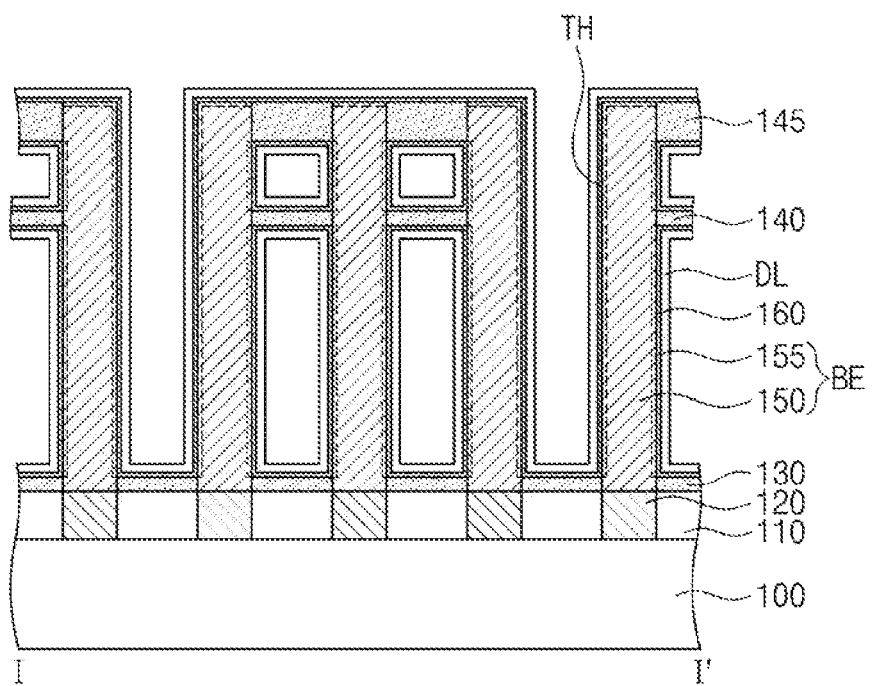

Referring to FIG. 12, the dielectric layer DL may be formed on the preliminary capping layer 165. The dielectric layer DL may conformally cover the preliminary capping layer 165. The dielectric layer DL may fill a portion of each of the penetration holes TH and may be extended to a region on a top surface of the preliminary capping layer 165. The dielectric layer DL may be formed by a layer-forming technique having a good step coverage property (e.g., by an atomic layer deposition (ALD) or chemical vapor deposition (CVD) process). The preliminary capping layer 165 may be oxidized by the dielectric layer DL to form the capping layer 160. The capping layer 160 may be in an electrically insulating state. In an implementation, the bottom electrodes BE, which are horizontally spaced apart from each other, may not be electrically connected to each other by or through the capping layer 160. The capping layer 160 may be formed of or include, e.g., a metal oxide or a metal oxynitride. A metallic element in the capping layer 160 may be the same as the doping metal in the preliminary capping layer 165. The capping layer 160 may be formed of or include, e.g., tantalum oxide, vanadium oxide, tantalum oxynitride, or vanadium oxynitride.

Referring back to FIGS. 1 and 2, the top electrode TE may be formed on the dielectric layer DL. The top electrode TE may cover the dielectric layer DL. The top electrode TE may fill a space between the bottom electrodes BE and a remaining portion of the penetration hole TH.

In other methods, a process of removing a preliminary capping layer may be performed before the formation of a dielectric layer. The second region may also be etched during the removal process, and this could lead to a technical problem, such as a reduction in an amount of dopants in a bottom electrode.

By contrast, according to an embodiment, a process of removing the preliminary capping layer 165 may not be performed before the formation of the dielectric layer DL. The dielectric layer DL may be formed on the preliminary capping layer 165 without removal of the preliminary capping layer 165, and an amount of dopants in the bottom electrode BE may be maximized. Furthermore, the additional removal process may not be performed, and it is possible to simplify the fabrication process and to reduce fabrication cost.

Furthermore, according to an embodiment, the preliminary capping layer 165 may include a doping metal having a large bandgap, and the doping metal may be selectively diffused only into the bottom electrode BE.

Figure 13:
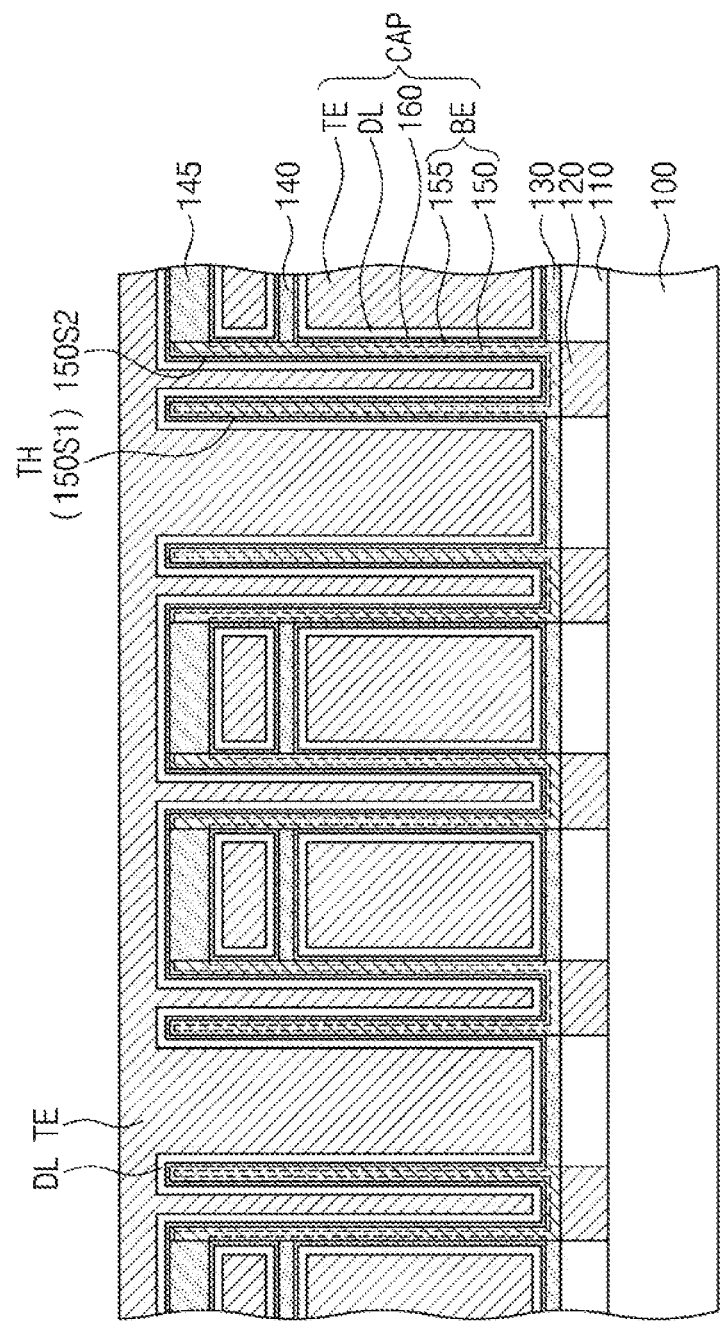
FIG. 13 is a sectional view of a semiconductor device according to an embodiment.

FIG. 13 is a sectional view of a semiconductor device according to an embodiment. For concise description, a previously described element may be identified by the same reference number without repeating an overlapping description thereof.

Referring to FIG. 13, a semiconductor device according to an embodiment may include the substrate 100, the interlayer insulating layer 110, the conductive contact 120, the etch stop layer 130, the bottom electrodes BE, the first supporting pattern 140, the second supporting pattern 145, the capping layer 160, the dielectric layer DL, and the top electrode TE. Each of the bottom electrodes BE may include the first region 150 and the second region 155. In an implementation, the bottom electrode BE may be shaped like a hollow cup or cylinder. The second region 155 may be adjacent to or at an outer side surface 150S1, an inner side surface 150S2, a bottom surface, and a top surface of the bottom electrode BE. The outer side surface 150S1 of the bottom electrode BE may correspond to the penetration hole TH. The capping layer 160 may conformally cover the bottom electrodes BE, the first supporting pattern 140, and the second supporting pattern 145. In an implementation, the capping layer 160 may conformally cover inner side surfaces and bottom surfaces of the penetration holes TH and may conformally cover the outer side surface 150S1, the inner side surface 150S2, and the bottom surface of the bottom electrode BE. Except for the afore-described features, the semiconductor device according to the present embodiment may be substantially the same as that described with reference to FIGS. 1 and 2.

Figure 14:
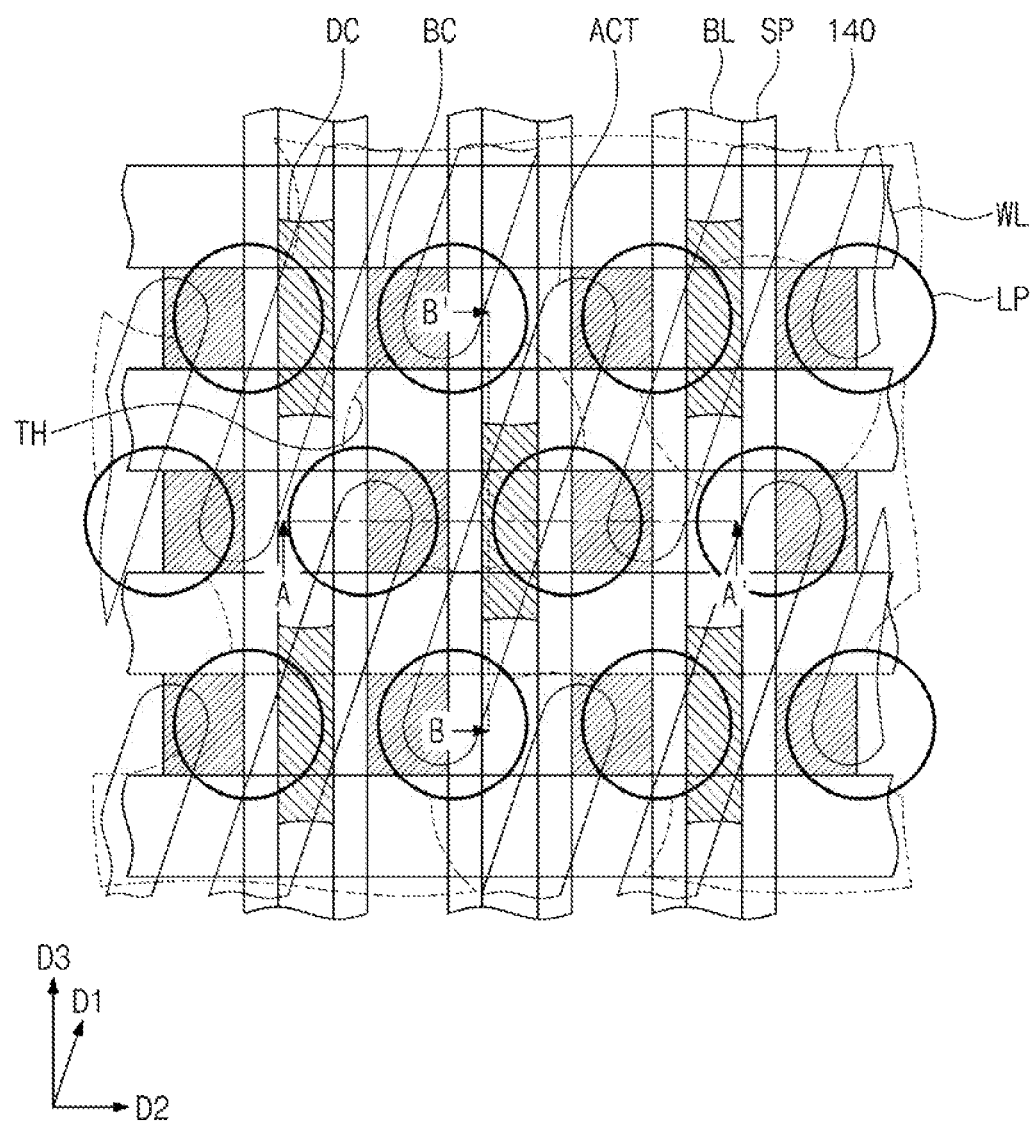
FIG. 14 is a plan view of a semiconductor device according to an embodiment.
Figure 15:
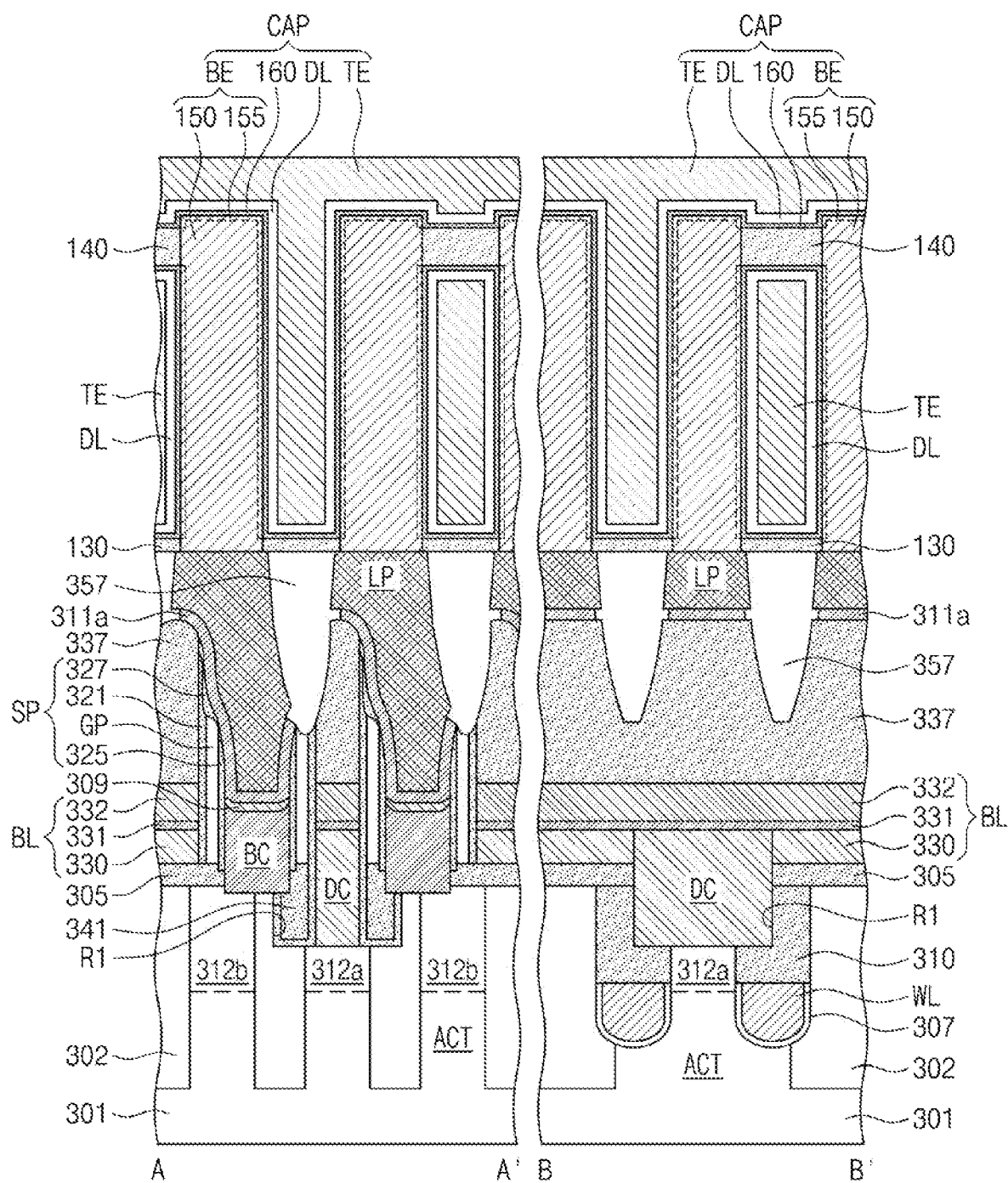
FIG. 15 is a sectional view taken along lines A-A' and B-B' of FIG. 14.

FIG. 14 is a plan view of a semiconductor device according to an embodiment. FIG. 15 is a sectional view taken along lines A-A' and B-B' of FIG. 14.

Referring to FIGS. 14 and 15, a semiconductor substrate 301 may be provided. The semiconductor substrate 301 may be, e.g., a silicon substrate, a germanium substrate, or a silicon-germanium substrate. A device isolation layer 302 may be in the semiconductor substrate 301. The device isolation layer 302 may be formed of or include an insulating material (e.g., silicon oxide). The device isolation layer 302 may define active regions ACT of the semiconductor substrate 301. When viewed in a plan view, each of the active regions ACT may have a bar-shaped pattern extending in a first direction D1. When viewed in a plan view, the active regions ACT may correspond to portions of the semiconductor substrate 301 surrounded by the device isolation layer 302.

Word lines WL may cross the active regions ACT. The word lines WL may be in grooves, which are formed in the device isolation layer 302 and the active regions ACT. The word lines WL may be parallel to a second direction D2 crossing the first direction D1. The word lines WL may be formed of or include a conductive material. A gate dielectric layer 307 may be between each of the word lines WL and an inner surface of each of the grooves. In an implementation, the bottoms of the grooves may be located at a relatively deep level in the device isolation layer 302 and may be located at a relatively shallow level in the active regions ACT. The gate dielectric layer 307 may be formed of or include, e.g., silicon oxide, silicon nitride, silicon oxynitride, or high-k dielectric materials. The word line WL may have a curved bottom surface.

A first impurity region 312a may be in each of the active regions ACT between a pair of the word lines WL, and a pair of second impurity regions 312b may be respectively disposed in opposite edge regions of each of the active regions ACT. In an implementation, the pair of the second impurity regions 312b may be spaced apart from each other with the first impurity region 312a interposed therebetween. In an implementation, the first and second impurity regions 312a and 312b may be doped with n-type impurities. The first impurity region 312a may correspond to a common drain region, and the second impurity regions 312b may correspond to a source region. Each of the word lines WL and the first and second impurity regions 312a and 312b adjacent thereto may constitute a transistor. The word line WL may be in the groove, and a channel length of a channel region below the word line WL may be increased within a given planar area.

Top surfaces of the word lines WL may be lower than top surfaces of the active regions ACT. A word line capping pattern 310 may be on each of the word lines WL. Each of the word line capping patterns 310 may be a line-shaped pattern, which is extended in a length direction of the word lines WL and covers the entire top surface of a corresponding one of the word lines WL. The word line capping patterns 310 may fill the grooves on the word lines WL. The word line capping pattern 310 may be formed of or include, e.g., silicon nitride.

An interlayer insulating pattern 305 may be on the semiconductor substrate 301. The interlayer insulating pattern 305 may be formed of or include insulating materials and may have a single- or multi-layered structure. The interlayer insulating pattern 305 may be formed of or include, e.g., silicon oxide, silicon nitride, or silicon oxynitride. When viewed in a plan view, the interlayer insulating pattern 305 may be an isolated island-shaped pattern. The interlayer insulating pattern 305 may be formed to cover both of end portions of a pair of the active regions ACT, which are adjacent to each other.

The semiconductor substrate 301, the device isolation layer 302, and an upper portion of the word line capping pattern 310 may be partially recessed to form a first recess region R1. When viewed in a plan view, the first recess region R1 may have a mesh shape. A side surface of the first recess region R1 may be aligned to a side surface of the interlayer insulating pattern 305.

Bit lines BL may be on the interlayer insulating pattern 305. The bit lines BL may be electrically connected to the first impurity region 312a. The bit lines BL may cross the word line capping patterns 310 and the word lines WL. The bit lines BL may be parallel to a third direction D3 crossing the first and second directions D1 and D2. The bit lines BL may include a first bit line pattern 330, a second bit line pattern 331, and a third bit line pattern 332, which are sequentially stacked. The first bit line pattern 330 may be formed of or include, e.g., doped or undoped polysilicon. The second bit line pattern 331 may be formed of or include a metal silicide. The third bit line pattern 332 may be formed of or include, e.g., a metallic material (e.g., tungsten, titanium, and tantalum) or a conductive metal nitride (e.g., titanium nitride, tantalum nitride, and tungsten nitride). A bit line capping pattern 337 may be on each of the bit lines BL. The bit line capping patterns 337 may be formed of or include an insulating material (e.g., silicon nitride).

Bit line contacts DC may be in the first recess regions R1 crossing the bit lines BL. The bit line contacts DC may be formed of or include, e.g., doped or undoped polysilicon. A side surface of the bit line contact DC may be in contact with a side surface of the interlayer insulating pattern 305. A side surface of the bit line contact DC in contact with the interlayer insulating pattern 305 may be concave. The bit line contact DC may electrically connect the first impurity region 312a to the bit line BL.

A lower gapfill insulating pattern 341 may be in a portion of the first recess region R1 which is not occupied by the bit line contact DC. The lower gapfill insulating pattern 341 may be formed of or include an insulating material and may have a single- or multi-layered structure. The lower gapfill insulating pattern 341 may be formed of or include, e.g., silicon oxide, silicon nitride, or silicon oxynitride.

Storage node contacts BC may be between an adjacent pair of the bit lines BL. The storage node contacts BC may be spaced apart from each other. The storage node contacts BC may be electrically connected to the second impurity regions 312b. In an implementation, the storage node contacts BC may be formed of or include doped or undoped polysilicon. Top surfaces of the storage node contacts BC may be concave.

A spacer SP may be between the bit line BL and the storage node contact BC. The spacer SP may include a first spacer 321 and a second spacer 325, which are spaced apart from each other by a gap region GP. In the present specification, the gap region GP may be referred to as an air gap region. The first spacer 321 may cover a side surface of the bit line BL and a side surface of the bit line capping pattern 337. The second spacer 325 may be adjacent to the storage node contact BC. The first spacer 321 and the second spacer 325 may be formed of or include the same material. The first spacer 321 and the second spacer 325 may be formed of or include, e.g., silicon nitride.

A bottom surface of the second spacer 325 may be lower than a bottom surface of the first spacer 321. A top surface of the second spacer 325 may be lower than a top surface of the first spacer 321. In this case, it is possible to help increase a process margin in a subsequent process of forming a landing pad LP and to help improve reliability in connection between the landing pad LP and the storage node contact BC. In an implementation, the first spacer 321 may be extended to cover the side surface of the bit line contact DC and the side and bottom surfaces of the first recess region R1. In an implementation, the first spacer 321 may be between the bit line contact DC and the lower gapfill insulating pattern 341, between the word line capping pattern 310 and the lower gapfill insulating pattern 341, between the semiconductor substrate 301 and the lower gapfill insulating pattern 341, and between the device isolation layer 302 and the lower gapfill insulating pattern 341.

A storage node ohmic layer 309 may be on the storage node contact BC. The storage node ohmic layer 309 may be formed of or include, e.g., a metal silicide. A diffusion prevention pattern 311a may conformally cover the storage node ohmic layer 309, the first and second spacers 321 and 325, and the bit line capping patterns 337. The diffusion prevention pattern 311a may be formed of or include a metal nitride (e.g., titanium nitride and tantalum nitride). The landing pad LP may be on the diffusion prevention pattern 311a. The landing pad LP may be electrically connected to the storage node contact BC. The landing pads LP may correspond to the conductive contact 120 of FIG. 2. The landing pad LP may be formed of or include a metal material (e.g., tungsten). A top surface of the landing pad LP may have a width larger than the storage node contact BC. A center of the landing pad LP may be shifted from a center of the storage node contact BC in the second direction D2. A portion of the bit line BL may be vertically overlapped with the landing pad LP. An upper side surface of the bit line capping pattern 337 may be overlapped with the landing pad LP and may be covered with a third spacer 327. A pad separation pattern 357 may be between the landing pads LP. The pad separation pattern 357 may correspond to the interlayer insulating layer 110 of FIG. 2. The pad separation pattern 357 may be formed of or include, e.g., silicon nitride, silicon oxide, silicon oxynitride, or a porosity material.

The etch stop layer 130 may be on the pad separation pattern 357. The etch stop layer 130 may cover a top surface of the pad separation pattern 357. The bottom electrodes BE may be on the landing pads LP, respectively. Each of the bottom electrodes BE may include the first region 150 and the second region 155. The first supporting pattern 140 may be between the bottom electrodes BE. Portions of the side surfaces of the bottom electrodes BE may be connected to the first supporting pattern 140. The capping layer 160 may be on the semiconductor substrate 301. The capping layer 160 may conformally cover the bottom electrodes BE and the first supporting pattern 140. The dielectric layer DL may be on the substrate 100. The dielectric layer DL may conformally cover the top surface of the capping layer 160. The top electrode TE may be on the dielectric layer DL. The etch stop layer 130, the bottom electrodes BE, the first region 150, the second region 155, the first supporting pattern 140, the capping layer 160, the dielectric layer DL, and the top electrode TE may be configured to have the same features as those described with reference to FIGS. 1 to 3.

According to an embodiment, it is possible to help reduce a parasitic capacitance between the bit line BL and the storage node contact BC, because the gap region GP may be between the first and second spacers 321 and 325 and permittivity of the air or vacuum is smaller than that of silicon oxide.

Figure 16:
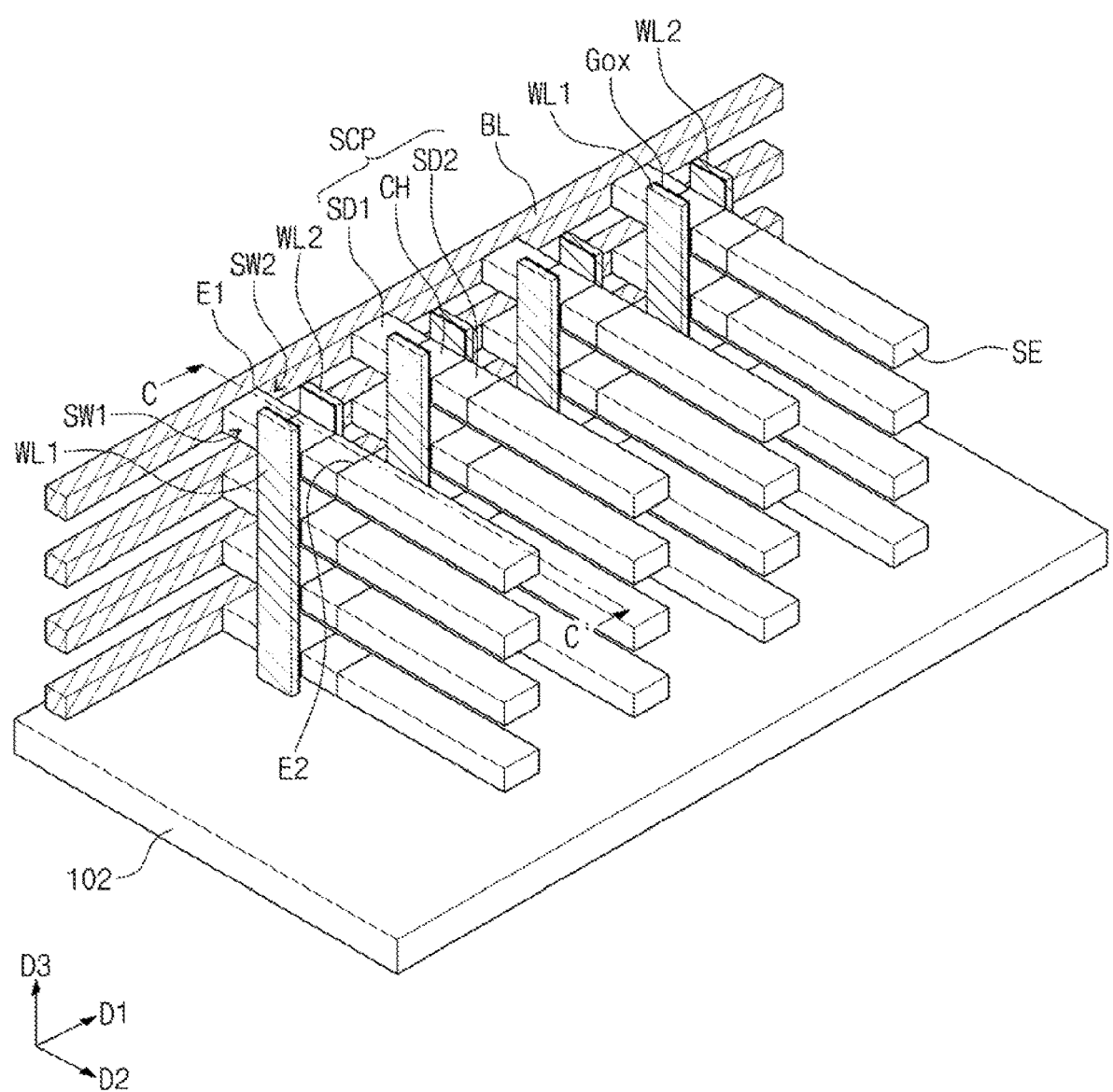
FIG. 16 is a perspective view of a three-dimensional semiconductor memory device according to an embodiment.
Figure 17:
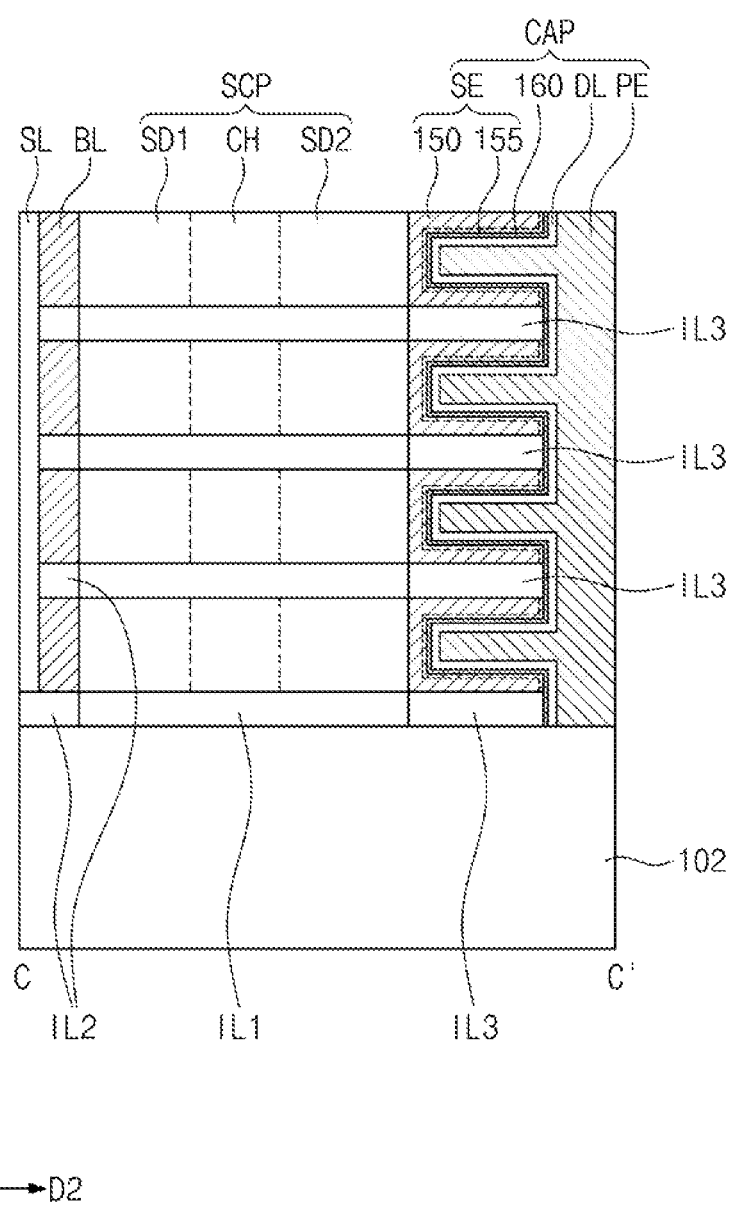
FIG. 17 is a sectional view taken along a line C-C' of FIG. 16.

FIG. 16 is a perspective view of a three-dimensional semiconductor memory device according to an embodiment. FIG. 17 is a sectional view taken along a line C-C' of FIG. 16. For concise description, a previously described element may be identified by the same reference number without repeating an overlapping description thereof.

Referring to FIGS. 16 and 17, semiconductor patterns SCP may be on a lower substrate 102. The semiconductor patterns SCP may be spaced apart from each other in two different directions (e.g., the first and third directions D1 and D3). Each of the semiconductor patterns SCP may be a bar-shaped pattern that is elongated in the second direction D2 crossing the first and third directions D1 and D3. The first and second directions D1 and D2 may be parallel to a top surface of the lower substrate 102. The third direction D3 may be perpendicular to the top surface of the lower substrate 102. Each of the semiconductor patterns SCP may have a first end portion E1 and a second end portion E2, which are spaced apart from each other. Each of the semiconductor patterns SCP may have a first side surface SW1 and a second side surface SW2, which connect the first end portion E1 to the second end portion E2 and are spaced apart from each other. The semiconductor patterns SCP may be formed of or include, e.g., silicon or germanium. Each of the semiconductor patterns SCP may include a first source/drain region SD1 adjacent to the first end portion E1, a second source/drain region SD2 adjacent to the second end portion E2, and a channel region CH between the first and second source/drain regions SD1 and SD2. Each of the first and second source/drain regions SD1 and SD2 may be an impurity or doped region, which is formed in the semiconductor pattern SCP. In an implementation, the channel region CH may also be doped with impurities. In an implementation, the first and second source/drain regions SD1 and SD2 may be doped to have a first conductivity type, and the channel region CH may be doped to have a second conductivity type different from the first conductivity type.

The bit lines BL may be stacked on the lower substrate 102 and may be spaced apart from each other in the third direction D3. The bit lines BL may be extended in the first direction D1. The first end portions E1 of the semiconductor patterns SCP, which are located at the same level, may be connected in common to a corresponding one of the bit lines BL.

A first electrode SE may be connected to the second end portions E2 of the semiconductor patterns SCP. The first electrode SE may correspond to the bottom electrode BE of FIGS. 1 and 2. The first electrode SE may include the first region 150 and the second region 155. The first region 150 and the second region 155 may have the same features as those described with reference to FIGS. 1 to 3. The first electrode SE may be shaped like a 90 degree rotated hollow cup or cylinder.

First word lines WL1 may be adjacent to the first side surfaces SW1 of the semiconductor patterns SCP. Second word lines WL2 may be adjacent to the second side surfaces SW2 of the semiconductor patterns SCP. The first and second word lines WL1 and WL2 may be extended from the top surface of the lower substrate 102 in the third direction D3. Each of the first word lines WL1 may be spaced apart from a corresponding one of the second word lines WL2 with the channel regions CH of the semiconductor patterns SCP therebetween. A gate insulating layer Gox may be between the first and second word lines WL1 and WL2 and the semiconductor patterns SCP. The gate insulating layer Gox may be formed of or include, e.g., a high-k dielectric material, silicon oxide, silicon nitride, or silicon oxynitride. In an implementation, the high-k dielectric material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Each of the bit lines BL and the first and second word lines WL1 and WL2 may be formed of or include a conductive material. The conductive material may include, e.g., a doped semiconductor material (e.g., doped silicon, doped germanium, or the like), a conductive metal nitride (e.g., titanium nitride, tantalum nitride, or the like), a metallic material (e.g., tungsten, titanium, tantalum, or the like), or a metal-semiconductor compound (e.g., tungsten silicide, cobalt silicide, titanium silicide, or the like).

The bit lines BL may be extended in the first direction D1. The bit lines BL may be in contact with an insulating isolation pattern SL. When viewed in a plan view, the insulating isolation pattern SL may have a line shape extending in the first direction D1.

The first word lines WL1 may serve as gate electrodes actually controlling charge conduction through the channel regions CH. The second word lines WL2 may serve as back gate electrodes, which control the movement of electric charges in the channel regions CH. A first interlayer insulating layer IL1 may be between the semiconductor patterns SCP. A second interlayer insulating layer IL2 may be between the bit lines BL. A third interlayer insulating layer IL3 may be between the first electrodes SE. The third interlayer insulating layer IL3 may support the first electrodes SE. The insulating isolation pattern SL may be in contact with side surfaces of the bit lines BL and the second interlayer insulating layers IL2. Each of the first to third interlayer insulating layers ILL IL2, and IL3 and the insulating isolation pattern SL may be formed of or include, e.g., silicon oxide, silicon oxynitride, or silicon nitride.

The first electrode SE may be in contact with the third interlayer insulating layer IL3. The capping layer 160 may be on the first electrode SE to cover the first electrode SE. The dielectric layer DL may be on the capping layer 160 to cover the capping layer 160. The capping layer 160 may be between the first electrode SE and the dielectric layer DL. A second electrode PE may be on the dielectric layer DL. The dielectric layer DL may be in contact with the second electrode PE. The second electrode PE may correspond to the top electrode TE of FIGS. 1 and 2. The first electrode SE, the dielectric layer DL, and the second electrode PE may constitute the capacitor CAP. The capping layer 160 and the dielectric layer DL may have substantially the same features as those described with reference to FIGS. 1 to 3.

By way of summation and review, with the development of the electronics industry, the memory device is becoming more highly integrated. As a result, linewidths of elements constituting the memory device may be decreasing.

A memory device may have higher reliability, in addition to the higher integration density. An increase in integration density of the memory device could cause deterioration in reliability of the memory device.

According to an embodiment, a capping layer, which includes a doping metal having a large bandgap, may be between a bottom electrode and a dielectric layer. In this case, when a voltage is applied to the bottom electrode BE, it is possible to help suppress formation of a depletion region, to help increase an electrostatic capacitance of a capacitor, and to help reduce an equivalent oxide thickness (EOT). In addition, due to the presence of the capping layer, electrons in the bottom electrode may be hardly leaked, and thus, it is possible to help reduce a leakage current in the semiconductor device. Furthermore, the capping layer may be in an electrically insulating state, a bridge defect issue in the semiconductor device may be reduced, and thus, the semiconductor device may have an improved reliability property.

According to an embodiment, a process of removing a preliminary capping layer may not be performed before the formation of the dielectric layer. The dielectric layer may be formed on the preliminary capping layer without removal of the preliminary capping layer, and an amount of dopants in the bottom electrode may be maximized. Furthermore, the additional removal process may not be performed, and it is possible to simplify the fabrication process and to reduce fabrication cost.

One or more embodiments may provide a semiconductor device including a capacitor.

One or more embodiments may provide a semiconductor device including a capacitor with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   bottom electrodes on the substrate, each bottom electrode including a first region and a second region, the second region containing an additional element relative to the first region;
   a first supporting pattern on the substrate and in contact with a portion of a side surface of each bottom electrode;
   a top electrode on the bottom electrodes;
   a dielectric layer between the bottom electrodes and the top electrode; and
   a capping layer between the bottom electrodes and the dielectric layer, the capping layer covering a top surface and a bottom surface of the first supporting pattern,
   wherein:
   the second region is in contact with the capping layer, and
   the capping layer and the dielectric layer include different materials from each other.

2. The semiconductor device as claimed in claim 1, wherein:
   the capping layer includes a metal oxide or a metal oxynitride, and
   a metallic element in the capping layer is the same as the additional element in the second region.

3. The semiconductor device as claimed in claim 1, wherein the dielectric layer is spaced apart from the bottom electrodes and the first supporting pattern.

4. The semiconductor device as claimed in claim 1, wherein:
   the capping layer includes a first doping metal,
   the additional element in the second region is a second doping metal, and
   a concentration of the first doping metal in the capping layer is higher than a concentration of the second doping metal in the second region.

5. The semiconductor device as claimed in claim 1, further comprising a second supporting pattern on the first supporting pattern and spaced apart from the first supporting pattern,
   wherein the capping layer is in direct contact with a top surface and a bottom surface of the second supporting pattern.

6. The semiconductor device as claimed in claim 1, further comprising:
   an interlayer insulating layer on the substrate;
   a conductive contact on the substrate and penetrating the interlayer insulating layer;
   an etch stop layer on the interlayer insulating layer; and
   a penetration hole on the substrate and exposing a top surface of the etch stop layer,
   wherein:
   the bottom electrodes penetrate the etch stop layer, and
   the capping layer covers an inner side surface and a bottom surface of the penetration hole.

7. The semiconductor device as claimed in claim 1, wherein:
   the capping layer includes a doping metal, and
   a bandgap of the doping metal ranges from 3 eV to 12 eV.

8. The semiconductor device as claimed in claim 1, wherein:
   the capping layer includes a doping metal, and
   the doping metal in the capping layer includes Ta, V, Mo, Cr, Sb, Co, Ni, Fe, Nb, or Cu.

9. The semiconductor device as claimed in claim 1, wherein a thickness of the capping layer ranges from 0.05 nm to 0.5 nm.

10. A semiconductor device, comprising:
    a substrate;
    bottom electrodes on the substrate, each of the bottom electrodes including a first region and a second region, the second region being a doped region;
    a first supporting pattern on the substrate and in contact with a portion of a side surface of each of the bottom electrodes;
    a top electrode on the bottom electrodes;
    a dielectric layer between the bottom electrodes and the top electrode; and
    a capping layer between the bottom electrodes and the dielectric layer, between a top surface of the first supporting pattern and the dielectric layer, and between a bottom surface of the first supporting pattern and the dielectric layer,
    wherein:
    the second region is between the first region and the capping layer, and
    the capping layer includes a doping metal.

11. The semiconductor device as claimed in claim 10, further comprising:
    an interlayer insulating layer on the substrate;

a conductive contact on the substrate and penetrating the interlayer insulating layer; and an etch stop layer on the interlayer insulating layer, wherein the capping layer is in contact with the etch stop layer.

12. The semiconductor device as claimed in claim 10, wherein the first region is in direct contact with the first supporting pattern.

13. The semiconductor device as claimed in claim 10, wherein:

the second region includes a doping metal that is the same as the doping metal in the capping layer, and a concentration of the doping metal in the second region decreases with decreasing distance to the first region.

14. The semiconductor device as claimed in claim 10, further comprising a second supporting pattern on the first supporting pattern and connecting the bottom electrodes to each other, wherein the dielectric layer is spaced apart from the second supporting pattern.

15. The semiconductor device as claimed in claim 10, wherein the second region has an arc shape, when viewed in a plan view.

16. The semiconductor device as claimed in claim 10, wherein the capping layer is an electrical insulator.

17. A semiconductor device, comprising:

a semiconductor substrate including a device isolation layer, the device isolation layer defining an active region, the active region including a first impurity region and a pair of second impurity regions, which are spaced apart from each other with the first impurity region therebetween;

a word line in the semiconductor substrate and crossing the active region;

a bit line on the semiconductor substrate and crossing the word line, the bit line being connected to the first impurity region;

a storage node contact on the semiconductor substrate and connected to the second impurity region;

a landing pad electrically connected to the storage node contact;

bottom electrodes on the landing pad, each of the bottom electrodes including a first region and a second region, the second region containing an additional element relative to the first region;

a top electrode on the bottom electrodes;

a supporting pattern between the bottom electrodes;

a dielectric layer between the bottom electrodes and the top electrode; and a capping layer between the bottom electrodes and the dielectric layer and covering a top surface and a bottom surface of the supporting pattern, wherein the second region is between the first region and the capping layer.

18. The semiconductor device as claimed in claim 17, wherein:

the capping layer includes a material different from the dielectric layer, and the capping layer includes a metal oxide or a metal oxynitride.

19. The semiconductor device as claimed in claim 17, wherein the capping layer includes a metal different from a metal included in the first region.

20. The semiconductor device as claimed in claim 17, wherein:

the dielectric layer is spaced apart from the bottom electrodes and the supporting pattern, and the first region is in direct contact with the supporting pattern.

* * * * *